US010288657B2

(12) United States Patent
Ivanov et al.

(10) Patent No.: US 10,288,657 B2
(45) Date of Patent: May 14, 2019

(54) SENSOR AND METHOD FOR DETECTING A NUMBER OF OBJECTS

(75) Inventors: Artem Ivanov, Landshut (DE); Axel Heim, Munich (DE)

(73) Assignee: MICROCHIP TECHNOLOGY GERMANY GMBH, Gilching (DE)

(*) Notice: Subject to any disclaimer, the term of this patent is extended or adjusted under 35 U.S.C. 154(b) by 125 days.

(21) Appl. No.: 14/116,973

(22) PCT Filed: May 8, 2012

(86) PCT No.: PCT/EP2012/058475
§ 371 (c)(1),
(2), (4) Date: Feb. 27, 2014

(87) PCT Pub. No.: WO2012/152801
PCT Pub. Date: Nov. 15, 2012

(65) Prior Publication Data
US 2014/0210489 A1    Jul. 31, 2014

(30) Foreign Application Priority Data

May 10, 2011   (DE) .......................... 10 211 075 622

(51) Int. Cl.
*H03K 17/955*     (2006.01)
*G01R 27/26*      (2006.01)
(Continued)

(52) U.S. Cl.
CPC ........... *G01R 27/2605* (2013.01); *G01B 7/14* (2013.01); *G01D 5/2405* (2013.01);
(Continued)

(58) Field of Classification Search
CPC ...................................................... G06F 3/044
See application file for complete search history.

(56) References Cited

U.S. PATENT DOCUMENTS 7,804,307 B1   9/2010   Bokma et al. ................ 324/663
9,092,095 B2   7/2015   Nakanishi et al.
(Continued)

FOREIGN PATENT DOCUMENTS

CN   101636908 A   1/2010   ........... H03K 17/955
CN   101866249 A   10/2010  ............. G02F 1/133
(Continued)

OTHER PUBLICATIONS

International Search Report and Written Opinion, Application No. PCT/EP2012/058475, 6 pages, dated Aug. 21, 2012.
(Continued)

*Primary Examiner* — Arleen M Vazquez
*Assistant Examiner* — Feba Pothen
(74) *Attorney, Agent, or Firm* — Slayden Grubert Beard PLLC (57) ABSTRACT

A sensor device for detecting a number of objects, has a number of electrode configurations forming a sensor surface, each electrode configuration having a number of measurement electrodes and each electrode configuration being associated with at least one transmitter electrode, and an evaluation device coupled to the measurement electrodes and the transmitter electrodes, which is adapted for using a time multiplexing method for applying an alternating signal to one of the transmitter electrodes, and to apply a predetermined constant electrical potential to the remaining transmitter electrodes, and tapping an electrical signal indicating the position of the object relative to the sensor surface at the measurement electrodes associated with the transmitter electrode having the electrical alternating signal applied.

23 Claims, 3 Drawing Sheets

(51) Int. Cl.
*G01D 5/24* (2006.01)
*G01B 7/14* (2006.01)

(52) U.S. Cl.
CPC .............. *H03K 17/955* (2013.01); *H03K 2217/960705* (2013.01); *H03K 2217/960765* (2013.01)

(56) References Cited

U.S. PATENT DOCUMENTS

| | | | | |
|---|---|---|---|---|
| 2002/0152048 | A1* | 10/2002 | Hayes | G06K 9/0002 702/127 |
| 2003/0102875 | A1 | 6/2003 | Fujiwara et al. | 324/663 |
| 2010/0134422 | A1* | 6/2010 | Borras | G06F 3/044 345/173 |
| 2011/0057670 | A1* | 3/2011 | Jordan | G06F 3/0416 324/679 |
| 2011/0095991 | A1* | 4/2011 | Philipp | G06F 3/0416 345/173 |
| 2012/0050216 | A1* | 3/2012 | Kremin | G06F 3/044 345/174 |
| 2012/0182229 | A1* | 7/2012 | Shepelev | G06F 3/044 345/173 |

FOREIGN PATENT DOCUMENTS

| | | | |
|---|---|---|---|
| WO | 2009/130165 A2 | 10/2009 | ............. G06F 3/033 |
| WO | 2010/009875 A1 | 1/2010 | ............. G05F 3/03 |
| WO | 2010/115940 A1 | 10/2010 | ............. G06F 1/32 |

OTHER PUBLICATIONS

German Office Action, Application No. 102011075622.1, 6 pages, dated Nov. 27, 2015.
Chinese Office Action, Application No. 201280022806.X, 8 pages, dated Dec. 1, 2015.
Chinese Office Action, Application No. 201280022806.X, 5 pages, dated Jul. 22, 2016.
Taiwan Office Action, Application No. 101116726, 12 pages, dated Apr. 12, 2017.
Chinese Office Action, Application No. 201280022806.X, 7 pages, dated May 4, 2017.
Taiwan Office Action, Application No. 101116726, 14 pages, dated Nov. 3, 2016.
European Office Action, Application No. 12721245.4, 5 pages, dated Dec. 4, 2017.
Taiwan Office Action, Application No. 101116726, 4 pages, dated Dec. 13, 2017.
Korean Office Action, Application No. 20137032666, 8 pages, dated Jun. 20, 2018.

* cited by examiner

SENSOR AND METHOD FOR DETECTING A NUMBER OF OBJECTS

CROSS-REFERENCE TO RELATED APPLICATIONS

This application is a U.S. National Stage Application of International Application No. PCT/EP2012/058475 filed May 8, 2012, which designates the United States of America, and claims priority to DE Patent Application No. 10 2011 075 622.1 filed May 10, 2011. The contents of which are hereby incorporated by reference in their entirety.

TECHNICAL FIELD

The invention relates to a sensor device for detecting a number of objects in the detecting range of the sensor device on a capacitive basis. The invention further relates to a method for detecting a number of objects by means of a sensor device according to the invention. The invention further relates to a handheld device, particularly an electrical handheld device, having a sensor device according to the invention, and that can be operated according to the method according to the invention.

BACKGROUND

In the state of the art of capacitive sensor devices, capacitive conditions between a sensor surface and an object present in the detecting range of the sensor device are measured or detected. The object present in the detecting range distorts the alternating electrical field in the detecting range. The measurement results allow conclusions to be drawn about the distance between the measurement electrodes of the sensor surface and the object and/or the position of the object relative to the sensor surface. The relationship between the object distance or position of the object and the measurement results is strongly non-linear.

If more than one object is present in the detecting range of the sensor device, then each individual object affects the distortion of the single alternating electrical field. The relationship between the measured values or measurement results and the distances of the objects from the sensor surface or the positions of the objects relative to the sensor surface becomes more complex as the number of objects increases, because the sensor measurement values no longer depend only on the position or distance of a single object. Precise detection of the distances of a plurality of objects from the sensor surface or the positions of a plurality of objects relative to the sensor surface can thereby no longer be guaranteed.

If the independence of some sensor measurement values from the distance or position of certain objects is nevertheless assumed for estimating the distance or position, this leads to systematic measurement errors that can cause artifacts. In the worst case, the measurement errors can lead to the distance or position of the object no longer being able to be detected or estimated.

In a concrete application for two-handed operation of a device having a capacitive sensor device, it is desirable to detect the positions of both hands or a plurality of fingers relative to the sensor device independently of each other.

Due to the sensitivity of the sensor measurement values, which depend on the distance of the objects from the sensor surface, the disturbance of the measurement value for a first nearby object due to field distortion caused by a second, more distant object is relatively small, so that the distance or position of the first object can be detected reliably. Conversely, the distance or position of the second object cannot be reliably detected, however.

In the prior art, attempts are being made to solve this problem by a large number of sensor electrodes being provided at the sensor surface, disposed at a short distance from each other. Individual sensor electrodes or a plurality of adjacent sensor electrodes can then be used for determining the distance or position of an object, albeit under the assumption that the influence of other objects on the measurement values of said electrodes is negligible. A further prerequisite for this approach, however, is that the distance of the objects from each other does not fall below a predetermined value. This applies particularly to greater distances of the objects from the sensor surface, i.e. if the sensor electrodes are less sensitive, and for distances between sensor electrodes that are small relative to the distance of the object from the sensor surface, thereby producing unfavorable geometric conditions for determining the X-Y position.

A further solution approach known from the prior art consists of spatially separating a plurality of sensor device or sensor electrodes from each other, so that each sensor device or sensor electrode forms or defines its own detecting range. Measurement values of a sensor device are thus associated with a corresponding object, while measurement values of a different sensor device are associated with the other object. In order to determine the distance or position of an object, sensor electrodes of a single sensor device can then be used or considered exclusively, wherein here again the assumption must be made that the influence of each of the other objects on the measurement values of said sensor device is negligible.

This solution approach is only practical, however, if there is sufficient spatial separation of the sensor devices or sensor electrodes.

SUMMARY

According to various embodiments, solutions can be provided allowing the position of a number of objects in a detecting range of a capacitive sensor device and/or the distance of a number of objects relative to a sensor surface of a capacitive sensor device to be determined or detected.

According to an embodiment, a sensor device for detecting a number of objects and a method for detecting a number of objects by means of a sensor device can be provided.

Accordingly, a sensor device for detecting a number of objects is disclosed, wherein the sensor device comprises:

a number of electrode configurations forming a sensor surface, each electrode configuration comprising a number of measurement electrodes and each electrode configuration being associated with at least one transmitter electrode, and an evaluation device coupled to the measurement electrodes and the transmitter electrodes, being adapted for using a time multiplexing method for applying an alternating signal to one of the transmitter electrodes, and applying a predetermined, preferably constant electrical potential to the remaining transmitter electrodes, and tapping an electrical signal indicating the position of the object relative to the sensor surface at the measurement electrodes associated with the transmitter electrode having the electrical alternating signal applied.

Because only one transmitter electrode is active at a time, namely the one to which the alternating electrical signal is applied, only one electrode configuration is also active at a time, so that the influence of a finger approaching the non-active electrode configuration on the electrical signal tapped from the active electrode configuration is significantly reduced in an advantageous manner. The approach of a finger to the active electrode configuration or the position of a finger relative to the active electrode configuration can thereby be significantly better determined or estimated.

It has also been found to be advantageous if at least one first auxiliary electrode is disposed between the electrode configurations, wherein the evaluation device is further adapted for connecting the first auxiliary electrode to the predetermined, preferably constant electrical potential in the time multiplexing process.

In this way, the influence of adjacent, non-active electrode configurations, that is, that of an object approaching the non-active electrode configurations, such as one or more fingers, on the active electrode configuration is advantageously reduced even further, so that the approach of a finger to the active electrode configuration or the position of a finger relative to the active electrode configuration can be even better determined or estimated.

At least one further auxiliary electrode can be disposed at the edge of each electrode configuration, wherein the evaluation device is further adapted for connecting the at least one further auxiliary electrode to the predetermined, preferably constant electrical potential, or for applying the alternating electrical signal thereto, in the time multiplexing process.

The sensor surface can be associated with a lower auxiliary electrode and/or an upper auxiliary electrode, wherein the evaluation device is further adapted for connecting the lower auxiliary electrode and/or the upper auxiliary electrode to the predetermined, preferably constant electrical potential, or to apply the alternating electrical signal thereto.

In one embodiment, the sensor surface can comprise two electrode configurations, wherein the two electrode configurations each comprise four measurement electrodes.

A contact-detecting electrode can be disposed between the measurement electrodes of at least one electrode configuration, serving for detecting contact. Contact-detecting electrodes can also be operated as measurement electrodes.

According to a method for detecting a number of objects by means of a sensor device comprising a number of electrode configurations forming a sensor surface, each electrode configuration comprising a number of measurement electrodes and each electrode configuration being associated with at least one transmitter electrode, in a time-multiplexing process an alternating electrical signal is applied to one of the transmitter electrodes,
the remaining transmitter electrodes are connected to a predetermined, preferably constant electrical potential, and
an electrical signal indicating the position of the object relative to the sensor surface is tapped at the measurement electrodes associated with the transmitter electrode having the electrical alternating signal applied.

At least one first auxiliary electrode can be disposed between the electrode configurations and connected to the predetermined, preferably constant electrical potential.

At least one further auxiliary electrode can be disposed at the edge of each electrode configuration, and the sensor surface is associated with a lower auxiliary electrode and/or an upper auxiliary electrode, wherein the at least one further auxiliary electrode and/or the lower auxiliary electrode and/or the upper auxiliary electrode are connected to the predetermined, preferably constant electrical potential, or the alternating electrical signal is applied thereto.

The predetermined, preferably constant electrical potential can be a ground potential of the sensor device.

In an electrical handheld device having a sensor device, a first electrode configuration of the sensor device is disposed in a left region of a housing case of the handheld device and a second electrode configuration of the sensor device is disposed in a right region of the housing case of the handheld device.

The sensor device can preferably be operated by means of a method according to various embodiments.

The electrical handheld device can be, for example, a mobile telephone, a computer mouse, a remote controller, an input means for a game console, a mobile mini-computer, a tablet PC, or the like.

BRIEF DESCRIPTION OF THE DRAWINGS

Further details and features of the invention and concrete embodiments can be found in the following description, in conjunction with the drawing. Shown are.

DETAILED DESCRIPTION

Figure 1:
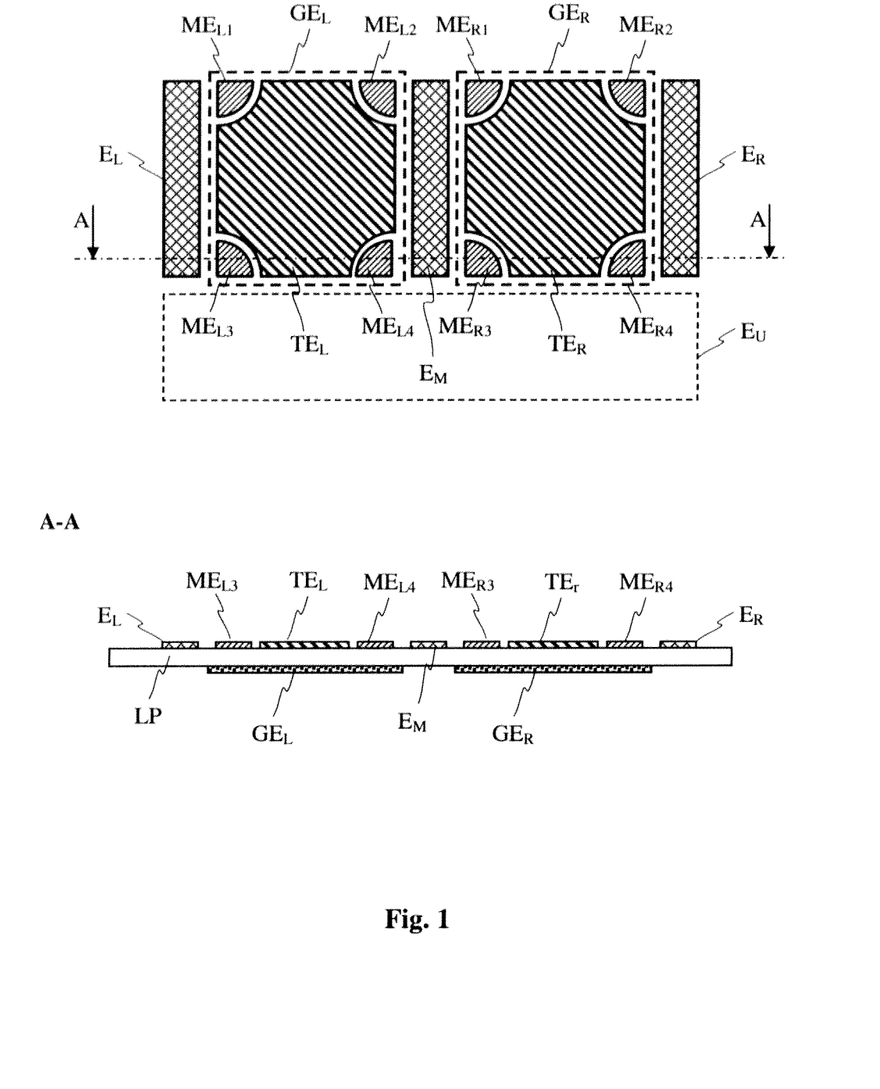
FIG. 1 an example of an electrode configuration of a capacitive sensor device in a plan view and a section view.

FIG. 1 shows an example of an electrode arrangement of a capacitive sensor device for detecting a number of objects, in particular the distance of the objects from a sensor surface or the positions of the objects relative to the sensor surface. The top area of FIG. 1 shows a plan view of the electrode arrangement, and the bottom area shows a section view of the electrode arrangement on a circuit board.

The electrode arrangement can be implemented as a double-layer circuit board LP. Two electrode configurations are disposed on the top side of the circuit board LP, together forming a sensor surface.

The left electrode configuration comprises four left measurement electrodes or sensor electrodes $ME_{L1}$ to $ME_{L4}$. The right electrode configuration comprises four measurement electrodes or sensor electrodes $ME_{R1}$ to $ME_{R4}$. Depending on the concrete requirements for the sensor surface, the left electrode configuration and the right electrode configuration can each comprise fewer or more than the four measurement electrodes shown here.

The two electrode configurations shown here each form a substantially rectangular sensor region, wherein the measurement electrodes $ME_{L1}$ to $ME_{L4}$ and $ME_{R1}$ to $ME_{R4}$ are disposed in the corner regions of each sensor area. The arrangement of the measurement electrode in each sensor area and the shape thereof can also be different from the arrangement shown in FIG. 1, depending on the concrete requirements for the sensor surface or sensor areas.

An approach of an object to the electrode configuration can be detected by means of the four measurement electrode of an electrode configuration, wherein the distance of the object from the sensor area and/or the position of the object relative to the sensor area can be detected or measured. The measurement electrodes are each coupled to an evaluation device that determines the distance and/or the position of the object from the electrical signals tapped from the measurement electrodes.

Two transmitter electrodes $GE_L$ and $GE_R$ are disposed below the measurement electrodes $ME_{L1}$ to $ME_{L4}$ and $ME_{R1}$ to $ME_{R4}$. A left transmitter electrode $GE_L$ is associated with the left measurement electrodes $ME_{L1}$ to $ME_{L4}$, and a right transmitter electrode $GE_R$ is associated with the right measurement electrodes $ME_{R1}$ to $ME_{R4}$. The transmitter electrodes can be disposed on the bottom side of the circuit board LP. The transmitter electrodes can, however, also be disposed on the top side of the circuit board LP and below the measurement electrodes, wherein the transmitter electrodes must then be galvanically separated from the measurement electrodes. The measurement electrodes are capacitively coupled to the corresponding transmitter electrodes. A capacitive coupling also forms between the measurement electrodes and a finger approaching the measurement electrodes, wherein a change in the distance of the finger from the measurement electrodes causes a change to the capacitive coupling or the capacitance between the finger and the measurement electrodes.

The transmitter electrodes $GE_L$ and $GE_R$ are each coupled to a signal generator in order to apply an alternating electrical signal thereto, so that an alternating electrical field is generated between each of the transmitter electrodes and the ground, defining and forming the monitoring range of each electrode configuration. The signal generator or signal generators can be part of the previously mentioned evaluation device.

A center auxiliary electrode $E_M$ is disposed between the left sensor area and the right sensor area, separating the left sensor area from the right sensor area in one embodiment. To this end, the center auxiliary electrode $E_M$ can be connected to a predetermined, preferably constant electrical potential, such as the ground of the sensor device. Propagation of the alternating electric field emitted at a transmitter electrode into the region of the other electrode configuration or sensor area can substantially be largely prevented or attenuated. Ultimately, this has the effect that the influence of an object approaching the left electrode configuration, for example, on the detection of an object approaching the right electrode configuration is reduced or eliminated.

A left auxiliary electrode $E_L$, a right auxiliary electrode $E_R$, and a lower auxiliary electrode $E_U$ are further provided, wherein the left and right auxiliary electrode $E_L$ and $E_R$ bound the measurement electrodes from the surrounding area at the sides, that is, objects approaching the sensor device from the side do not substantially affect the detection of objects present in the detecting range of the electrode configuration.

The lower auxiliary electrode $E_U$ can be disposed below the generator electrode $GE_L$, $GE_R$. A further upper auxiliary electrode, not shown here, can also be provided. Depending on the wiring of the lower auxiliary electrode $E_U$, that is, depending on whether the alternating electrical signal of the transmitter electrode is applied to the lower auxiliary electrode $E_U$, or said electrode is connected to a predetermined electrical potential, such as the ground of the sensor device, the range of the alternating electric field emitted at the transmitter electrodes can be increased or bounded from below. Also, the alternating electrical signal that is applied to the transmitter electrodes $GE_L$, $GE_R$ can also be applied to the left and/or right auxiliary electrode $E_L$ or $E_R$ in order to increase the range.

In the example shown in FIG. 1 of an electrode arrangement, one contact detecting electrode $TE_L$, $TE_R$ (touch electrode) is disposed between each of the measurement electrodes $ME_{L1}$ to $ME_{L4}$ and $ME_{R1}$ to $ME_{R4}$, which can be provided for simply detecting an object making contact with the surface.

In the following, the method for detecting a number of objects by means of a sensor device according to various embodiments, which can, for example, comprise an electrode arrangement as shown in FIG. 1, is explained in detail.

The left electrode configuration and the right electrode configuration are operated in a time multiplexing process, wherein the left electrode configuration is active in a first step, while the right electrode configuration is inactive.

In order to deactivate the right electrode configuration, the right transmitter electrode $GE_R$ and optionally the center auxiliary electrode $E_M$ are connected to a predetermined electrical potential, preferably to the ground of the capacitive sensor device.

An alternating electrical signal is applied to the left transmitter electrode $GE_L$, so that an alternating electrical field is generated, forming and defining the detecting range of the left electrode configuration. Deactivating the right electrode configuration substantially causes the alternating electrical field generated by the left transmitter electrode $GE_L$ to not be emitted across the right electrode configuration. An object present in the range of the right electrode configuration, such as a finger, can thus disturb or influence the alternating electrical field across the left electrode configuration only insignificantly, that is, an object present in the range of the right electrode configuration is thereby largely "masked."

In a second step, the right electrode configuration is activated, while the left electrode configuration is deactivated.

In a manner analogous to the first step, the left transmitter electrode $GE_L$ is thereby connected to a predetermined electrical potential, preferably to the ground of the sensor device. The potential of the center auxiliary electrode $E_M$, in contrast, remains unchanged, that is, remains connected to the predetermined electrical potential, particularly to the ground of the sensor device, in the second step as well.

In the second step, an alternating electrical signal is now applied to the right transmitter electrode $GE_R$, so that an alternating electrical field is emitted there which forms and defines the detecting range or a monitoring range of the right electrode configuration. Deactivating the left electrode configuration, here again, substantially causes the alternating electrical field generated by the right transmitter electrode $GE_R$ to not extend substantially across the left electrode configuration. This particularly causes the left electrode configuration to emit no alternating electrical field. An object, such as a finger, present or moving in the range of the left electrode configuration therefore disturbs the alternating electrical field emitted at the right electrode configuration only insignificantly. The finger over the left electrode configuration is thereby largely "masked."

The method according to various embodiments described for detecting a number of objects by means of a sensor device can also be used if, for example, the position of only one object, such as a finger, is to be detected or estimated. In that case the full sensitive area, that is, the full sensor surface of the capacitive sensor device, can be used. To this end, both transmitter electrodes can be active, that is, an alternating electrical signal can be applied to both transmitter electrodes $GE_L$, $GE_R$, so that an alternating electrical field is emitted at both transmitter electrodes, together forming the detecting range or observation range of the capacitive sensor device.

The alternating electrical field can also be applied to the center auxiliary electrode $E_M$ disposed between the two electrode configurations. Furthermore, the alternating electrical field can also be applied to the left auxiliary electrode $E_L$ and the right auxiliary electrode $E_R$. It is also possible to use the two contact detecting electrodes $TE_L$, $TE_R$ as measurement electrodes or sensor electrodes, which are then connected to the analysis device in the same manner as the measurement electrodes $ME_{L1}$ to $ME_{L4}$ and $ME_{R1}$ to $ME_{R4}$, and the electrical signals thereof are analyzed accordingly. The contact detecting electrodes $TE_L$, $TE_R$, however, can also be used exclusively for detecting contact.

Furthermore, the sensor device according to various embodiments can also be used for implementing the entire sensor surface as a touch-sensitive region. Both the left and the right auxiliary electrodes, as well as the center auxiliary electrode, can in this case be connected to the contact detecting electrodes $TE_L$, $TE_R$.

In the two steps of the method according to various embodiments described above, the left auxiliary electrode $E_L$ and the right auxiliary electrode $E_R$ can either be connected to a predetermined potential, preferably to the ground of the capacitive sensor device, or the alternating electrical signal can be applied thereto. In the first case, the range can thereby be limited beyond the side edge area of the sensor device. In the second case, that is, if the alternating electrical signal is applied to the left auxiliary electrode and the right auxiliary electrode, the range of the emitted alternating electric field can be increased. The same applies to the lower auxiliary electrode $E_U$ and an upper auxiliary electrode, if an upper auxiliary electrode is provided.

After the second step of the method according to various embodiments, said method can be continued at the first step, so that the first step and the second step of the method are executed substantially cyclically.

Figure 2:
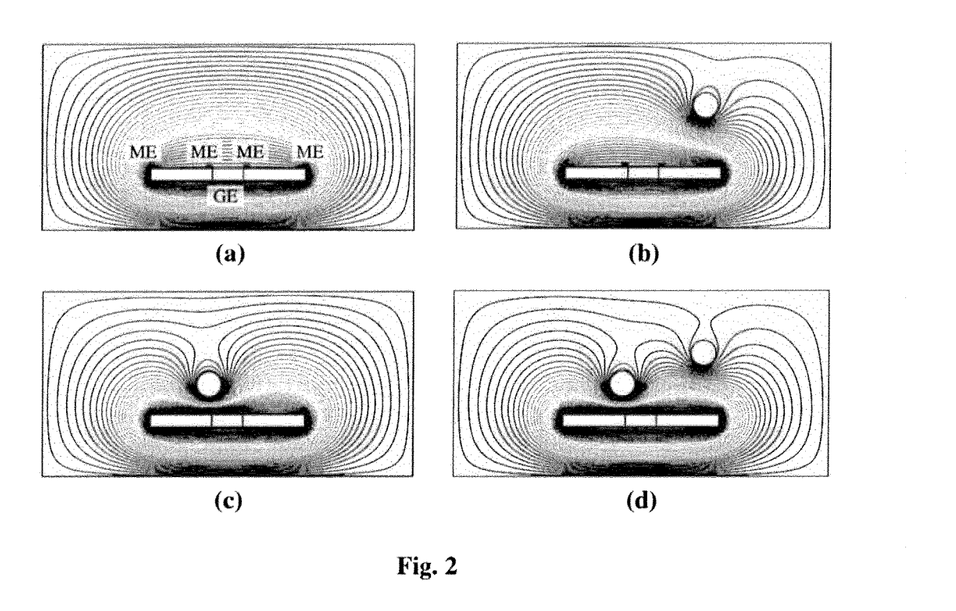
FIG. 2 two-dimensional electrostatic simulations (equipotential lines) of an object influencing an alternating electric field, wherein a plurality of sensor electrodes are associated with a single transmitter electrode.
Figure 3:
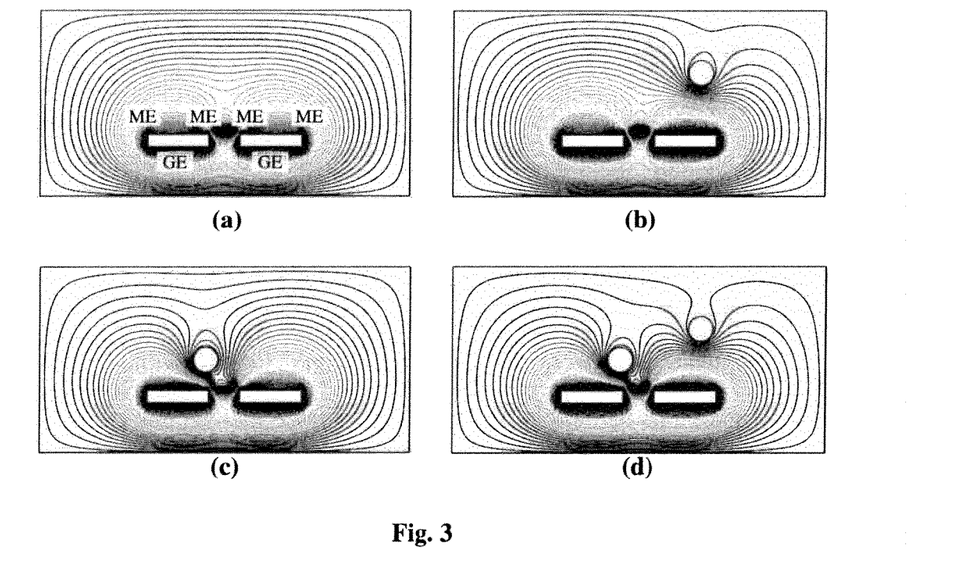
FIG. 3 a two-dimensional electrostatic simulation (equipotential lines) of an object influencing an alternating electric field, wherein two measurement electrodes are associated with each transmitter electrode and wherein an auxiliary electrode is disposed between the transmitter electrodes and the corresponding measurement electrodes.
Figure 4:
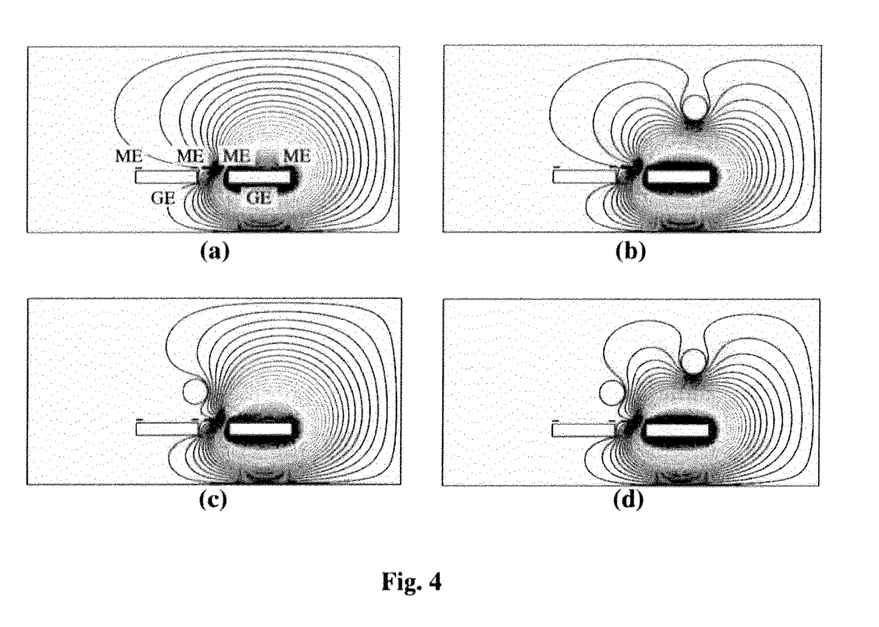
FIG. 4 a two-dimensional electrostatic simulation (equipotential lines) of an object influencing an alternating electric field, wherein two measurement electrodes are associated with each transmitter electrode and wherein one of the transmitter electrodes or the measurement electrodes associated "with said transmitter electrode are deactivated.

FIGS. 2 to 4 each show 2D simulations of an influence of objects, such as fingers, on an alternating electric field. Four sensor electrodes or measurement electrodes each are disposed along an X-axis across a generator, that is, one or more transmitter electrodes. In each case, the influence on the potential due to a left finger on the second sensor electrode from the right, which is associated with a right finger, is observed.

In the two-dimensional electrostatic simulations, the transmitter electrodes are each shown as rectangles, and the short lines above them represent the measurement electrodes. The fingers are depicted as circles, wherein the left circle represents a left finger and the right circle represents a right finger. The dielectric medium of the circuit board is assumed to be air, so it is not shown explicitly here.

FIG. 2 to FIG. 4 each show four situations, wherein the views each correspond substantially to the section view shown in FIG. 1.

No finger is present in the detecting range of the capacitive measurement device.
(a) A right finger is present above the right half of the sensor device. The distance thereof from the measurement electrodes of the right half is greater than the distance between the measurement electrodes.
(b) A left finger is present above the left half of the sensor device. The distance thereof from the measurement electrodes of the left half of the sensor device is significantly less than the distance between the measurement electrodes.
(c) Both a right and a left finger are present in the detecting range of the measurement device. The distances of the fingers from the measurement electrodes of the sensor device thereby are the same as in (b) and (c).

In the simulations, the ground potential (0 V) is associated with both the frame and the finger, which is shown here as a circle, while the generator or the transmitter electrodes have a potential of 1 V. The result of the simulation is the calculated potentials at the measurement electrodes. FIG. 2 through FIG. 4 each show the equipotential lines.

The measurement signal at an electrode used for calculating the position of an object (finger) is the difference between the electrode potential without the object in the detecting range and the electrode potential with the object in the detecting range. If the measurement signal is caused by the object associated with the electrode, then said signal can be considered a desired signal. The greater the desired signal, the more precisely the position of the object can be determined.

When detecting a number of objects in the detecting range of the capacitive sensor device, the influences of the objects on the electrical field can be seen as interference signals to each other. When detecting the positions of two fingers, for example, the left finger generates an interference signal for those electrodes (the right measurement electrodes) that are to measure the position of the right finger. The smaller the influence of the left finger on the right electrodes (that is, the smaller the interference signal,) the more precisely the position of the right finger can be determined by the right measurement electrodes using the measurement data (that is, the desired signal.)

The interpretation of the simulation results allows the magnitude of the interference signal (from the left finger) to be determined relative to the desired signal (from the right finger.) Using these data, the best possible configuration of the sensor device can be found. In the simulation, the left finger (interference source) is disposed very close to the right half of the sensor device, in order to investigate the influence thereof relative to the right finger, which is located at a greater distance from the sensor device.

FIG. 2 shows the case having a generator electrode or transmitter electrode, wherein the dynamic range here is about 971 mV. The dynamic range is defined as the largest possible difference in potential (signal difference) at the measurement electrode. Said difference in potential is given as the difference between the potential for "finger infinitely far away" and the potential for "finger touching the measurement electrode," wherein in the latter case the touching finger brings the sensor electrode substantially to ground potential. The influence of the left finger in this example is about 34 mV, and the influence of the right finger (desired signal) is about 10.6 mV.

FIG. 3 shows the two-dimensional electrostatic simulation of the influence on an alternating electric field by a left finger, wherein in contrast to FIG. 2, the transmitter electrode is implemented in two parts, and the center auxiliary electrode $E_M$ is disposed between the two transmitter electrodes and connected to the ground potential of the capacitive sensor device. The dynamic range is reduced by the center auxiliary electrode $E_M$, but the interference effect of the left finger on the potential of the observed sensor electrode (second sensor or measurement electrode from the right) is reduced as well. The influence of the left finger in this example is about 18.4 mV, and the influence of the right finger (desired signal) is about 8.7 mV.

FIG. 4 shows a two-dimensional electrostatic simulation of the influence on an alternating electric field, as shown in FIG. 3, wherein, however, the left transmitter electrode is also connected to the ground potential of the capacitive sensor device. The dynamic range is thereby reduced even further, but the interference effect of the left finger on the potential of the observed sensor electrode (second sensor or measurement electrode from the right) is further reduced as well. The interference of the left finger in this example is about 6.1 mV, and the influence of the right finger (desired signal) is about 7.6 mV.

The numerical values determined for the example are summarized in the tables below:

Table 1 shows the values of the potential at the observed sensor electrode (second sensor or measurement electrode from the right) determined in the simulation. Table 2 shows the measurement signals at said measurement electrode that correspond to the simulated events.

TABLE 1

Potential at the measurement electrode

| Potential [mV] | no finger | right finger | left finger | left & right finger |
|---|---|---|---|---|
| FIG. 2 | 971.0 | 960.4 | 937.0 | 930.2 |
| FIG. 3 | 819.2 | 810.5 | 800.8 | 794.8 |
| FIG. 4 | 803.3 | 795.7 | 797.2 | 791.3 |

TABLE 2

Measurement signal at the measurement electrode

| Measurement signal [mV] | right finger | left finger | left & right finger |
|---|---|---|---|
| FIG. 2 | 10.6 | 34.0 | 40.8 |
| FIG. 3 | 8.7 | 18.4 | 24.4 |
| FIG. 4 | 7.6 | 6.1 | 12.0 | better ↓

As can be seen from Table 2, the measurement signal at the measurement electrode in all three cases is greatest when the left and right finger are present. In the case wherein the left transmitter electrode is connected to the ground potential of the capacitive sensor device, the influence of the left finger on the potential of the observed measurement electrode is less than the influence of the right finger, although the left finger is positioned closer to said electrode than the right finger.

Significantly better and more robust determination of the position of a plurality of objects in an observation range of a capacitive sensor device is possible by means of the sensor device and by means of the method according to various embodiments.

The capacitive sensor device can, for example, be used in a handheld device, such as a mobile telephone, wherein the distance of a plurality of fingers from the mobile telephone or the position of the fingers relative to the mobile telephone are to be determined. The circuit complexity, particularly the number of sensor electrodes, can be significantly reduced relative to conventional capacitive sensors. Also associated therewith is a significantly reduced complexity for producing electrical handheld devices having a capacitive sensor device and for producing the capacitive sensor device itself.

REFERENCE LIST $ME_{L1}$ to $ME_{L4}$ left measurement electrodes 1 to 4 (sensor electrodes)
$ME_{R1}$ to $ME_{R4}$ right measurement electrodes 1 to 4 (sensor electrodes)
$GE_L$ left transmitter electrode
$GE_R$ right transmitter electrode
$TE_L$ left contact-detecting electrode (touch electrode)
$TE_R$ right contact-detecting electrode (touch electrode)
$E_L$ left auxiliary electrode
$E_R$ right auxiliary electrode
$E_M$ center auxiliary electrode
$E_U$ lower or upper auxiliary electrode

What is claimed is:

1. A sensor device for detecting a number of objects relative to a sensor surface, comprising:
a plurality of non-overlapping electrode configurations forming the sensor surface, each electrode configuration comprising at least one transmitter electrode and a plurality of measurement electrodes arranged such that a signal transmitted by the at least one transmitter electrode is received by the plurality of measurement electrodes, wherein measurement electrodes of each electrode configuration are separate from measurement electrodes of other electrode configurations;
wherein the objects do not touch the sensor surface, and
an evaluation device coupled to the measurement electrodes and the transmitter electrodes and configured to determine a contactless position of an object relative to the sensor surface and being adapted for performing time multiplexing thereby selecting one of the plurality of electrode configurations, wherein for each selected electrode configuration, an alternating signal is fed to the at least one transmitter electrode of the selected one of the plurality of electrode configurations, and for remaining electrode configurations, a predetermined constant electrical potential is applied to each at least one transmitter electrode of the remaining electrode configurations, and wherein the evaluation device receives electrical signals from the measurement electrodes associated with the at least one transmitter electrode receiving the electrical alternating signal and determines said contactless position from said electrical signals.

2. The sensor device according to claim 1, wherein at least one first auxiliary electrode is disposed between the electrode configurations, and wherein the evaluation device is further adapted for applying the predetermined electrical potential to the first auxiliary electrode.

3. The sensor device according to claim 2, wherein at least one further auxiliary electrode is disposed at the edge of every electrode configuration, and wherein the evaluation device is further adapted for applying the predetermined electrical potential or the alternating electrical signal to the at least one further auxiliary electrode.

4. The sensor device according to claim 1, wherein the sensor surface is associated with a lower auxiliary electrode arranged adjacent to a bottom edge of adjacent electrode configurations and/or an upper auxiliary electrode arranged adjacent to a top edge of adjacent electrode configurations, and wherein the evaluation device is further adapted for applying the predetermined electrical potential or the alternating electrical signal to the lower auxiliary electrode and/or the upper auxiliary electrode.

5. The sensor device according to claim 1, wherein the sensor surface comprises two electrode configurations, the two electrode configurations each comprising four measurement electrodes.

6. The sensor device according to claim 1, wherein a contact-detecting electrode is disposed in a center area between the measurement electrodes of at least one electrode configuration, serving to detect contact.

7. A method for detecting a number of objects relative to a sensor surface by means of a sensor device comprising a plurality of non-overlapping electrode configurations forming the sensor surface, wherein the objects do not touch the sensor device, each electrode configuration comprising at least one transmitter electrode and a plurality of measurement electrodes arranged such that a signal transmitted by the at least one transmitter electrode is received by the plurality of measurement electrodes, wherein measurement electrodes of each electrode configuration are separate from measurement electrodes of other electrode configurations;

the method performing time multiplexing thereby selecting one of the electrode configurations, wherein for each selected electrode configuration:

an alternating electrical signal is applied to the at least one transmitter electrode of the selected one of the plurality of electrode configurations, the at least one transmitter electrodes of remaining electrode configurations are connected to a predetermined constant electrical potential, evaluating electrical signals received from the plurality of measurement electrodes associated with the at least one transmitter electrode receiving the electrical alternating signal, and determines a contactless position with respect to the sensor surface of the sensor device from said electrical signals.

8. The method according to claim 7, wherein at least one first auxiliary electrode is disposed between the electrode configurations, and is connected to the predetermined electrical potential.

9. The method according to claim 8, wherein at least one further auxiliary electrode is disposed at the edge of every electrode configuration, and wherein the sensor surface is associated with a lower auxiliary electrode arranged adjacent to a bottom edge of adjacent electrode configurations and/or an upper auxiliary electrode arranged adjacent to a top edge of adjacent electrode configurations, wherein the alternating electrical signal or the predetermined electrical potential are applied to the at least one further auxiliary electrode and/or the lower auxiliary electrode and/or the upper auxiliary electrode.

10. The method according to claim 7, wherein the predetermined electrical potential is a ground potential of the sensor device.

11. An electrical handheld device having a sensor device for detecting a number of objects relative to a sensor surface, comprising a plurality of non-overlapping electrode configurations forming the sensor surface, each electrode configuration comprising at least one transmitter electrode and a plurality of measurement electrodes arranged such that a signal transmitted by the at least one transmitter electrode is received by the plurality of measurement electrodes, wherein measurement electrodes of each electrode configuration are separate from measurement electrodes of other electrode configurations;

wherein the objects are each at a distance above the sensor surface and an evaluation device coupled to the measurement electrodes and the transmitter electrodes and configured to determine a contactless position of an object relative to the sensor surface and being adapted for performing time multiplexing thereby selecting one of each of the electrode configurations, wherein for each selected one the electrode configurations, an alternating signal is fed to the at least one transmitter electrode of the selected one of the plurality of electrode configurations, and for remaining electrode configurations, a predetermined constant electrical potential is applied to each at least one transmitter electrode of the remaining electrode configurations, and wherein the evaluation device receives electrical signals from the measurement electrodes associated with the at least one transmitter electrode receiving the electrical alternating signal and determines said contactless position from said electrical signals, wherein a first electrode configuration of the sensor device is disposed in a left area of a housing case of the handheld device and a second electrode configuration of the sensor device is disposed in a right area of the housing case of the handheld device.

12. The electrical handheld device according to claim 11, wherein for each electrode configuration a single transmitter electrode is provided and arranged in a plane below a plane comprising the measurement electrodes associated with the single transmitter electrode.

13. The electrical handheld device according to claim 12, wherein at least one first auxiliary electrode is disposed between the electrode configurations, and is connected to the predetermined electrical potential.

14. The electrical handheld device according to claim 13, wherein at least one further auxiliary electrode is disposed at the edge of every electrode configuration, and wherein the sensor surface is associated with a lower auxiliary electrode arranged adjacent to a bottom edge of adjacent electrode configurations and/or an upper auxiliary electrode arranged adjacent to a top edge of adjacent electrode configurations, wherein the alternating electrical signal or the predetermined electrical potential are applied to the at least one further auxiliary electrode and/or the lower auxiliary electrode and/or the upper auxiliary electrode.

15. The electrical handheld device according to claim 12, wherein the predetermined electrical potential is a ground potential of the sensor device.

16. The electrical handheld device according to claim 11, wherein at least one first auxiliary electrode EM is disposed between adjacent electrode configurations, and wherein the evaluation device is further adapted for applying the predetermined electrical potential to the first auxiliary electrode.

17. The electrical handheld device according to claim 11, wherein at least one further auxiliary electrode is disposed at the edge of every electrode configuration, and wherein the evaluation device is further adapted for applying the predetermined electrical potential or the alternating electrical signal to the at least one further auxiliary electrode.

18. The electrical handheld device according to claim 11, wherein the sensor surface is associated with a lower auxiliary electrode arranged adjacent to a bottom edge of adjacent electrode configurations and/or an upper auxiliary electrode arranged adjacent to a top edge of adjacent electrode configurations, and wherein the evaluation device is further adapted for applying the predetermined electrical potential or the alternating electrical signal to the lower auxiliary electrode and/or the upper auxiliary electrode.

19. The electrical handheld device according to claim 11, wherein the sensor surface comprises two electrode configurations, the two electrode configurations each comprising four measurement electrodes.

20. The electrical handheld device according to claim 11, wherein a contact-detecting electrode is disposed in a center area between the measurement electrodes of at least one electrode configuration, serving to detect contact.

21. The electrical handheld device according to claim 20, wherein each electrode configurations comprises four measurement electrodes arranged to define a frame.

22. The sensor device according to claim 1, wherein for each electrode configuration a single transmitter electrode is provided and arranged in a plane below a plane comprising the measurement electrodes associated with the single transmitter electrode.

23. The method according to claim 7, wherein for each electrode configuration a single transmitter electrode is provided and arranged in a plane below a plane comprising the measurement electrodes associated with the single transmitter electrode.

\* \* \* \* \*